United States Patent [19]

Sattin et al.

[11] Patent Number: 5,034,694
[45] Date of Patent: Jul. 23, 1991

[54] MINIMUM BASIS SET MR ANGIOGRAPHY

[75] Inventors: William Sattin, Cleveland Hts.; Larry Kasuboski, Solon; Wayne R. Dannels, Willoughby, all of Ohio

[73] Assignee: Picker International, Inc., Highland Hts., Ohio

[21] Appl. No.: 440,895

[22] Filed: Nov. 22, 1989

[51] Int. Cl.⁵ ............................................ G01R 33/20
[52] U.S. Cl. ............................................ 324/309
[58] Field of Search .................... 324/306, 307, 309; 128/653 AF

[56] References Cited

U.S. PATENT DOCUMENTS

| | | | |
|---|---|---|---|
| 4,532,473 | 7/1985 | Wehrli | 324/306 |
| 4,683,431 | 7/1987 | Pattany et al. | 324/306 |
| 4,689,560 | 8/1987 | Nayler et al. | 324/306 |
| 4,697,147 | 9/1987 | Moran et al. | 324/306 |
| 4,728,890 | 3/1988 | Pattany et al. | 324/309 |
| 4,849,697 | 7/1989 | Cline et al. | 324/306 |
| 4,918,386 | 4/1990 | Dumoulin et al. | 324/309 |

OTHER PUBLICATIONS

Battocletti et al., "Clinical Applications . . . (NMR), Limb Blood Flowmeter", Proc. of the IEEE, vol. 67, No. 9, Sep. 1979, pp. 1359–1361.

*Primary Examiner*—Michael J. Tokar
*Attorney, Agent, or Firm*—Fay, Sharpe, Beall, Fagan, Minnich & McKee

[57] ABSTRACT

A radio frequency pulse (32), a gradient pulse (34), and a first frequency offset pulse (38a) are applied to cause the presaturation region (36a) adjacent one face of an imaging volume (30) such that material flowing into the imaging volume from that face is saturated. An imaging sequence is applied which generates magnetic resonance image data that has non-saturated flow in the imaging volume identified by a characteristic phase modulated intensity. The saturation and gradient pulses are applied again with a second frequency offset pulse (38b) to position the saturation region (36b) adjacent the opposite face of the image volume. The exact same imaging sequence is applied to generate a second set of image data in which non-saturated flowing material is identified by a characteristic phase modulated intensity. Magnitude values from these two data sets are reconstructed (72, 74) into image representations that are subtractively combined (76), to form a difference image representation. In the difference image representation, the static material has essentially a zero value, flowing material that entered from one face is strictly positive, and flowing material that entered from the other face is strictly negative. In this manner, two different flowing materials, such as venous and arterial blood, are separately encoded in only two imaging sequences.

16 Claims, 3 Drawing Sheets

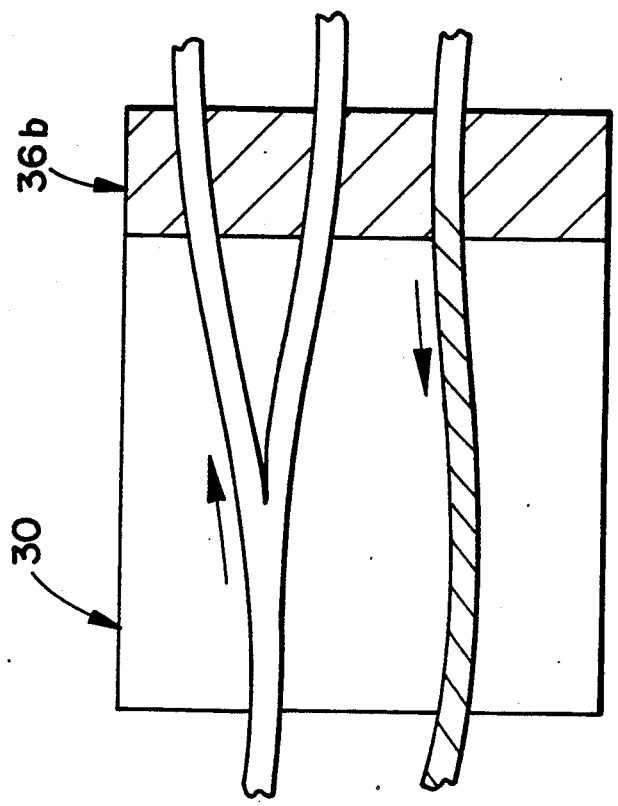
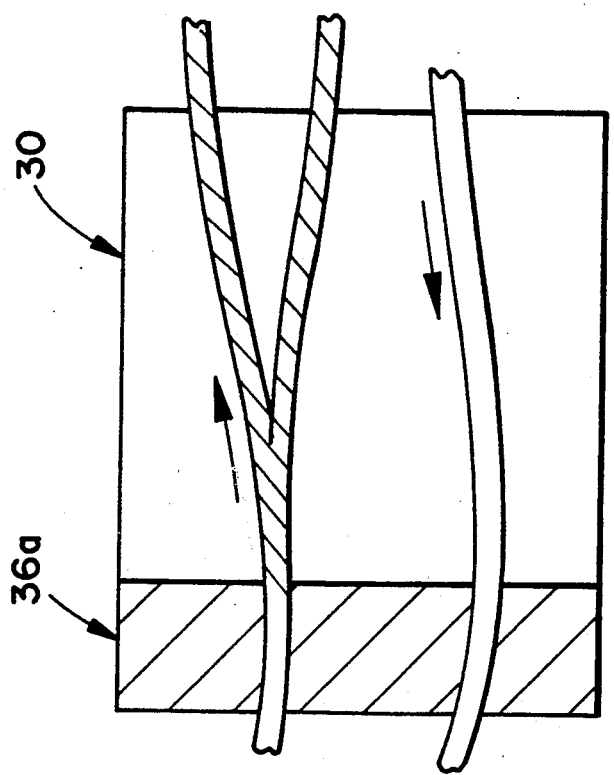

MINIMUM BASIS SET MR ANGIOGRAPHY

BACKGROUND OF THE INVENTION

The present invention relates to the selective magnetic resonance examination of moving material. It finds particular application in conjunction with the magnetic resonance imaging of separately identified venous and arterial blood flows and will be described with particular reference thereto. It is to be appreciated, however, that the present invention may also find application in conjunction with the imaging of other flowing, accelerating, or moving tissue or materials as well as spectroscopic analysis of such moving materials.

Heretofore, magnetic resonance angiography has had its basis in three main features: (1) the tagging or sensitizing of an NMR signal to flow, (2) the suppression or removal of signal from static material, or (3) projection imaging. Of the several methods by which the magnetic resonance signal can be sensitized or tagged to flow, two are most common. The first depends on the time-of-flight effect which depends on a wash-in/wash-out phenomenon. The second, gradient moment nulling, depends upon flow-dependent phase shifts.

The time-of-flight effects are used in two ways. In one, blood which is flowing into the imaging region is tagged just before an image is collected. When an image is acquired, the tagged blood that has flowed into the image region gives a characteristic signal that can be used to separate it from the stationary material. In a second way, a special RF pulse is used during each repetition to label the moving blood. The signal or lack of signal from the labelled blood can be detected when the tagged blood has moved into the imaging volume.

Flow dependent phase shifts can also be utilized for flow signal sensitizing. By selecting the gradients to zero selected orders of gradient moments, flow or other motion can be tagged with phase information. Quantitative direction, speed, and other information can be derived from the phase. See for example, U.S. Pat. Nos. 4,689,560 and 4,683,431, both to G. L. Naylor and P. M. Pattany. Analogously, phase can be nulled or zeroed for a number of gradient moments to maximize the flow signal. See U.S. Pat. No. 4,728,890 to Pattany and McNally.

The suppression or removal of the static material may be achieved by several techniques. For flow related enhancement techniques, a ray tracing algorithm can be utilized to pick out and isolate the highest signal in the image set. With blood tagged to have the highest signal, these identified regions correlate to the moving blood.

The static signal may also be removed by subtracting two images. That is, a first image is taken utilizing one of the above techniques to tag the flow and a second image is taken without flow encoding. When the static image is subtracted from the flow sensitized image, only the moving tissue remains. Note again, the above referenced patents of Naylor and Pattany.

In angiography, it is often advantageous to differentiate between venous and arterial flows. Conveniently, the venous and arterial flows are usually in opposite directions through the selected slice or other imaging region. To image both flows individually, three image sets are taken. For example, one of the time-offlight effects may be utilized to encode the blood entering from one side of the imaging region just before data for a first image is acquired. Blood entering from the opposite side of the image region is analogously encoded just before for a second image is acquired. A third image of the static material without flow encoding is also acquired, either before, after, or between the two flow images. Subtracting the static image from one of the flow images provides a venogram and subtracting the static image from the other flow image provides an arteriogram. Thus, three sets of image data are required in order to generate two flow images. See for example, U.S. Pat. No. 4,849,697 to Cline and Dumoulin.

A third factor associated with magnetic resonance angiography is image projection. Some of these methods attempt to capture vessels in very thick, directly acquired projection images, while others use postprocessing to piece together stacks of slices into a three dimensional data set. The slices may have been acquired either as multiple two dimensional slices or as part of a three dimensional volume acquisition.

A primary problem with these flow imaging techniques is that they required the acquisition of enough data to reconstruct three images of the same slice or region in order to produce only two angiogram images. Further, when these techniques were implemented such that the flowing material was tagged due to an applied gradient phase shift, it was subject to error due to magnetic imperfections, e.g. eddy currents. These imperfections introduced unwanted and uncompensated phase shifts which were erroneously treated as properly phase encoded information. Others of these techniques required a compromise between the flow to stationary material contrast. That is, the imaging pulse sequences were chosen, as best as possible, such that the flowing material appeared bright, while the static material appeared low in intensity and somewhat iso-intense.

The present invention provides a new and improved imaging technique which overcomes the above referenced problems and others.

SUMMARY OF THE INVENTION

In accordance with the present invention, a first flowing material is tagged, e.g. saturated, as it enters an image region. A gradient moment nulling imaging sequence is utilized which generates a first image that is sensitized to a second flowing material in the image region. The tagging of the first flowing material is utilized to identify the first flowing material relative to the second. The second flowing material is then tagged and the identical imaging technique is utilized to image the region again, generating a second image. In the second image, the first flowing material is sensitized for identification and the second flowing material is identified by the tagging. The first and second images are subtractively combined such that static material is mapped essentially to zero, one of the flows is mapped to larger positive values and the other flow is mapped to larger negative values.

In accordance with a more limited aspect of the present invention, the material that is flowing into the imaging region is tagged by being saturated. Saturated material in the image region commonly appears at substantially zero intensity scale.

In accordance with another more limited aspect of the present invention, the flow sensitive imaging technique utilizes flow dependent phase shifts to provide quantitative flow signal sensitization.

In accordance with another more specific application of the present invention, the first flow is a venous blood flow and the second flow is an arterial blood flow and the large positive and negative values are displayed as a venogram and an arteriogram.

In accordance with another aspect of the present invention, the magnetic resonance apparatus is provided which has means for performing each of the above discussed steps.

One advantage of the present invention is that two magnetic resonance angiograms are acquired from only two image data sets.

Another advantage of the present invention resides in its relative insensitivity to eddy currents. The present invention is no more sensitive to eddy currents than conventional imaging techniques.

Another advantage of the present invention is that it reduces postprocessing time. Information concerning both flows is mapped in a single image or set of images rather than separate images for each flow.

Still further advantages will become apparent to those of ordinary skill in the art upon reading and understanding the following detailed description of the preferred embodiment.

BRIEF DESCRIPTION OF THE DRAWINGS

The invention may take form in various steps and arrangements of steps or in various components and arrangements of components. The drawings are only for purposes of illustrating a preferred embodiment and are not to be construed as limiting the invention.

FIGS. 3A and 3B are diagrammatic illustrations of the tagging of venous and arterial blood flows.

DETAILED DESCRIPTION OF THE PREFERRED EMBODIMENTS

Figure 1:
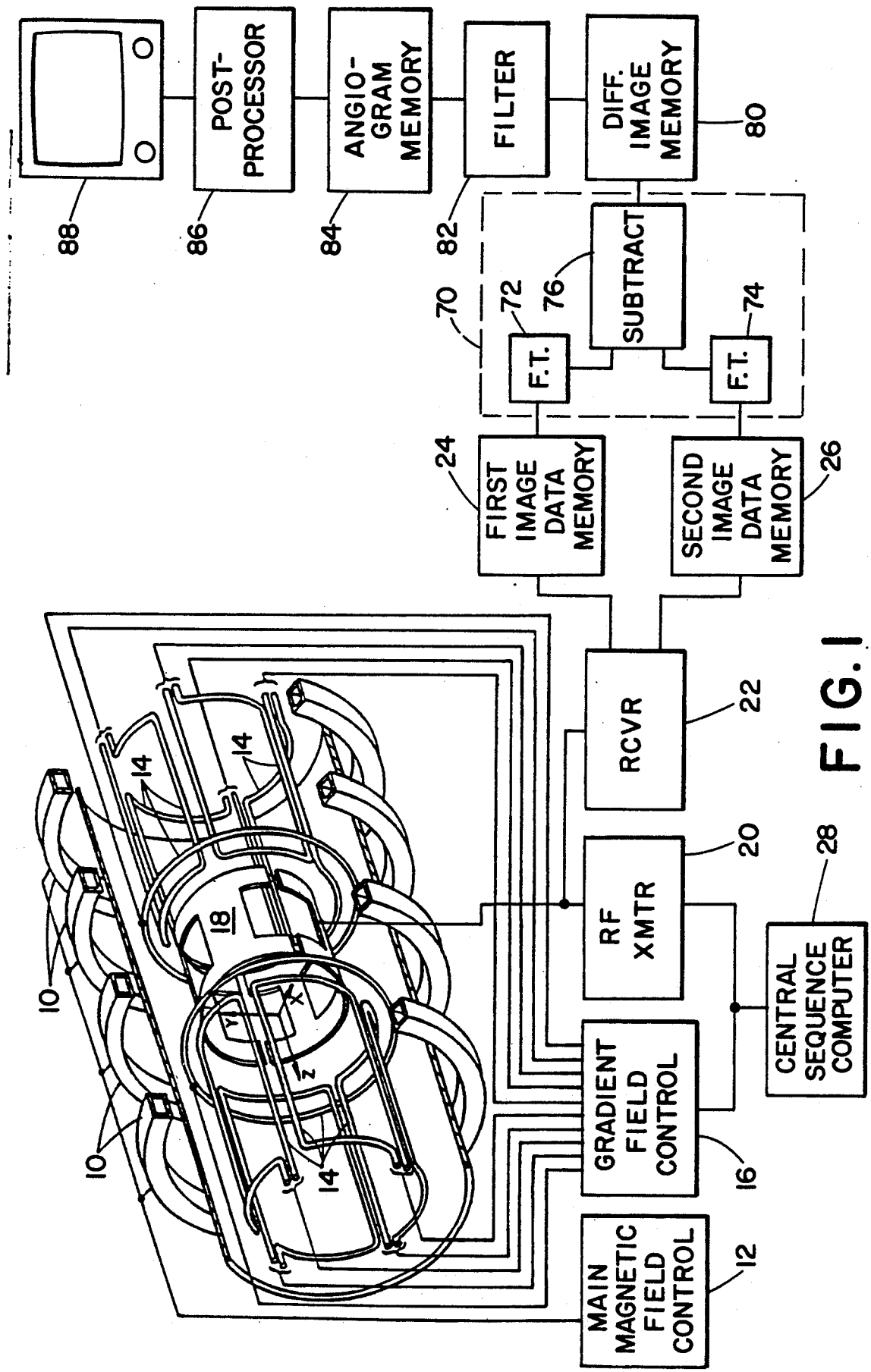
FIG. 1 is a diagrammatic illustration of a magnetic resonance imaging apparatus in accordance with the present invention.

With reference to FIG. 1, magnets lo under the control of a main magnetic field control means 12 generate a generally uniform main magnetic field through an image region. Gradient field coils 14 convert electrical pulses from a gradient field control 16 into magnetic field gradients across the main magnetic field. More specifically, the gradient field control includes means for applying gradients along three orthogonal axes, commonly denoted as x, y, and z axes. As described in greater detail below, these gradients may be utilized as slice select gradients, read gradients, phase encode gradients, and various dephasing gradients. Radio frequency (RF) pulses are transmitted into the examination region by a radio frequency coil 18. An RF generator or transmitter 20 formats RF pulses with selected magnitudes and frequencies. As described in greater detail below, the radio frequency transmitter includes means for generating saturation radio frequency pulses, resonance excitation pulses, and resonance manipulation pulses, and offset frequencies.

Magnetic resonance data is received by a radio frequency receiver 22. The resonance data for a first flow encoding image is stored in a first memory 24 and magnetic resonance data from a second flow encoded image representation is stored in a second flow image memory means 26.

An image sequence control means 28 controls the gradient field control 16 and the transmitter 20 to implement an imaging pulse sequence which results in a high signal intensity from flowing fluid. In this preferred embodiment, gradient moment nulling is applied along three axes to insure that signal intensity is not lost due to motion induced signal dephasing. Short echo times (TE) are selected to reduce the loss of signal intensity due to motion induced signal dephasing. Preferably, a three dimensional volume acquisition is conducted to minimize slice thickness which reduces the dephasing that would otherwise result within a slice, as well as minimized partial volume averaging. A volume or slice 30 from which the image is to be acquired is preferably picked substantially perpendicular to the feeding vasculature. This orientation increases flow contrast due to the entry slice phenomenon discussed above and renders spin saturation more robust.

Figure 2:
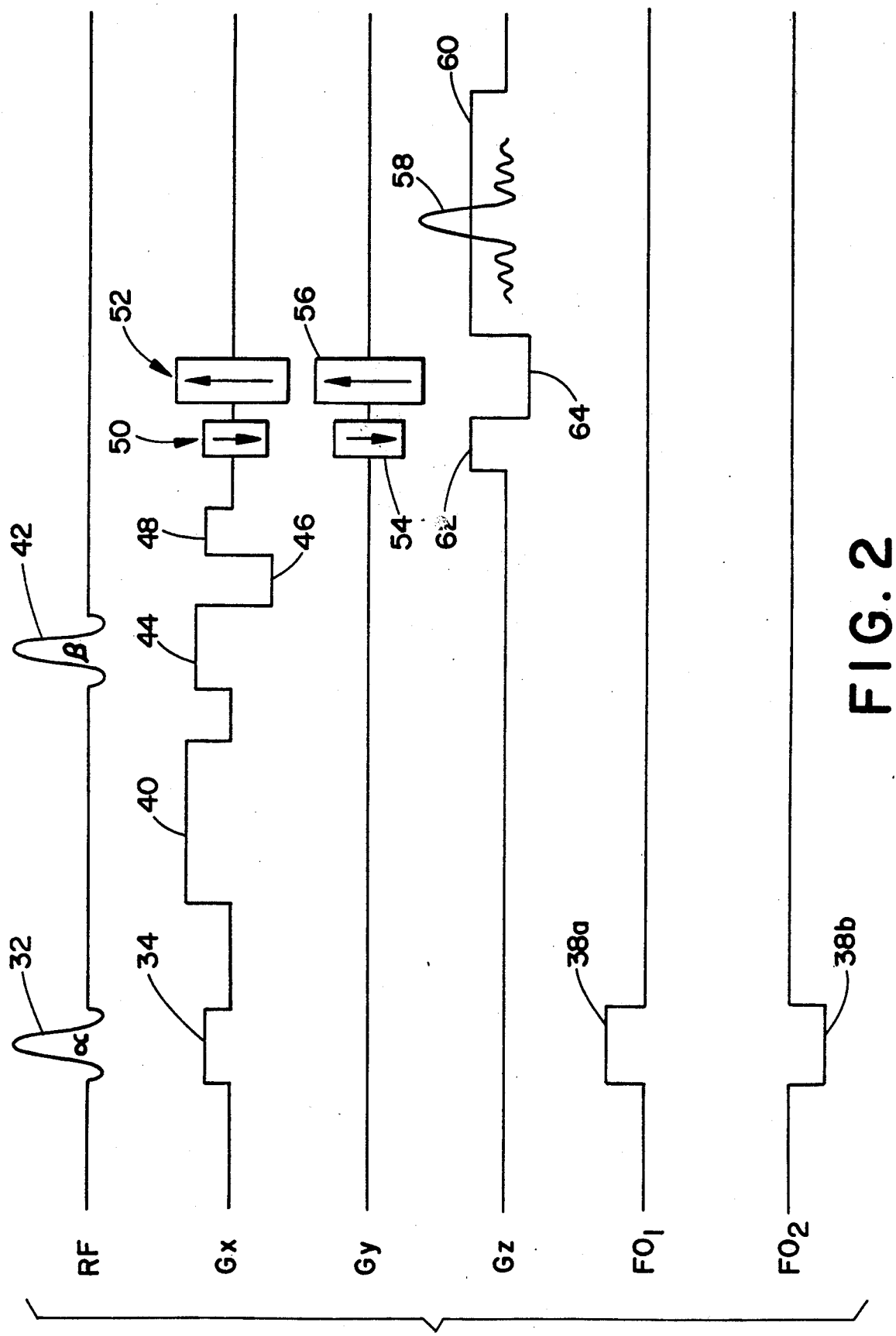
FIG. 2 is a diagrammatic illustration of an exemplary gradient field echo imaging sequence for implementing the present invention.

With reference to FIGS. 2 and 3A, the radio frequency transmitter 20 and the gradient field control 16 concurrently apply a radio frequency pulse 32 and a gradient pulse 34 to saturate resonance in a first region 36a. When first flow image data is generated, a first frequency offset pulse 38a is applied concurrently with the presaturation pulse to offset the frequency, i.e. shift the spatial position at which saturation occurs. The frequency offset is sized to position the presaturation region 36a on one side of the image volume With reference to FIG. 3B, when pulses of the second flow image are to be generated, an equal and opposite frequency offset pulse 32 is applied to position the presaturation region 36b to the opposite side of the image volume. In this manner, flowing material entering the imaging volume from one side is saturated before the first image data is acquired and material flowing into the image region from the opposite side is saturated before the second image data is acquired. It will be noted that but for the frequency offset pulses 38a and 38b, the following described pulse sequence is identical for both flow images in order to assure that this stationary material appears substantially the same in both images and to eliminate sensitivity to eddy currents.

The gradient control 16 includes means for applying a dephasing gradient pulse 40 to dephase the NMR signal resulting from the first RF pulse 32 such that it does not contribute to the acquired data. The radio frequency transmitter 20 applies a resonance excitation pulse 42 concurrently with a slice select gradient pulse 44 which are matched in order to excite dipoles only in the imaging volume 30 to resonance. The sequence control means 28 then controls the gradient control means 16 to apply moment nulling gradients 46 and 48 in order to zero the first moment gradients in time as described in the above referenced Pattany and McNally patent. Optionally, higher order moments may also be zeroed to eliminate acceleration and other motions of a higher order than velocity.

The gradient control 16 further includes means for applying a pair of opposite polarity primary phase encode gradients 50 and 52. For three dimensional volume imaging, a pair of secondary phase encode gradients 54, 56 are also applied. The pairs of opposite polarity phase encode gradients are applied such that the first moments in time are nulled while still linearly incrementing the zeroth moment to introduce static spatial phase encoding. Although a gradient echo sequence is illustrated, the radio frequency transmitter includes means for applying a magnetic resonance refocusing pulses when a spin echo sequence is selected. In either gradient or spin echo sequences, the magnetization refocuses into a magnetic resonance echo signal 58. The gradient control means further includes means for applying a read gradient pulse 60 during the magnetic resonance signal for frequency encoding the NMR signal. It also applies moment nulling read axis pulses 62 and 64 such that the zeroth and first order moments are zeroed at the center of the NMR signal 58.

In this manner, the spin saturation region 36a is made to occur parallel to the imaging volume 30 and to one side of it while data for the first flow encoded image is generated. The spin saturation region is designed by timing relative to the imaging sequence, flip angle, gradient moment nulling, and the like in order to insure that flowing material which resides in the saturation region prior to residing in the imaging volume is unable to contribute to the magnetic resonance signal. This is accomplished by carefully balancing the saturation region with expected flow rate, expected fluid spin-lattice relaxation time TR, time from saturation to echo formation, the tip angle of the RF pulse used for saturation, and the moments of the gradient applied after saturation to aid in signal dephasing. Of course, other types of tagging may also be utilized.

The saturation region is moved to the opposite side 36b of the imaging volume 30 in preparation for acquiring magnetic resonance data for the second flow encoded image. As discussed above, the spatial repositioning of the presaturation region is done by altering the frequency of the saturation RF pulse 32 applied in the presence of the gradient 34. This applied gradient, as well as other applied gradients and RF wave forms, are identical in form and substance for both the first and second image data sets with frequency offsets 38a and 38b being the only difference in the two sequences.

With reference again to FIG. 1, after the data has been acquired, a difference image means 70 produces a difference image representation or angiogram from the acquired data in the first and second flow encoded image memories 24 and 26 Fourier transform means 72, 74 transform the two image data sets into first and second image representations. A subtraction means 76 subtractively combines the two image representations to produce the difference image representation. The difference image representation is stored in a difference image memory means 80.

It is to be appreciated that the identity of the image sequences but for the symmetric frequency offsets 38a and 38b assures that the static material appears substantially the same in both images. Thus, in the angiogram or difference image, the stationary material subtracts substantially to a zero value. Patient movement or other environmental changes between the two sequences may cause some of the points to have values only near zero. A filter means 82 may be provided for setting all points that are within a preselected tolerance of zero to zero.

The saturated flowing material in each image is substantially at zero brightness for a minimal signal intensity and the flowing material which has experienced gradient moment nulling only, and not saturation, is at substantially full brightness. When the two images are subtracted, the non-saturated flowing material in one image assumes large positive values and the non-saturated flowing material from the other image assume large negative values. Thus, the static material values are grouped around one signal intensity, the venous flow is grouped around another intensity, and the arterial flow is grouped around a third intensity. The filter means may also set the values grouped around the large negative values to a first non-zero constant and the position value grouping to a second, characteristic non-zero value. An angiogram memory 84 stores an image representation in which static material as a zero value, venous or first flowing material has one characteristic value, and arterial or second flowing material has a different characteristic value.

A postprocessing means 86 displays the bidirectional flow encoded information in any of a plurality of selected formats. For example, on a color monitor 88 one image is displayed with the two flows encoded in different colors, e.g. red and blue. Alternately, two images can be displayed, one for the negative value grouping and the other for the positive value grouping.

Numerous variations on this technique may be provided. For example, there is no restriction on the type of imaging sequence which may be utilized in conjunction with the saturation regions and the subsequent post-acquisition processing. A single projection slice may be acquired, multiple two dimensional slices as either a two dimensional multislice or a series of single slice acquisitions, or a set of three dimensional slices may be acquired. Additionally, this technique is not limited to conventional Fourier transform NMR imaging. Other imaging techniques such as echo planar imaging, and the like may also be utilized to generate the two images. The imaging sequences may be synchronized with physiological events with cardiac or other physiological gating.

The modifications to the parameters associated with the saturations can also be enacted to offer full support for any NMR imaging technique. The imaging region need not be perpendicular to the direction of flow although it is preferred that the saturation regions are perpendicular to the flow direction. Particularly, in a volume imaging technique, the blood flow may enter the imaging volume from two contiguous faces or sides. To encode these two flows, the presaturation regions are formed along the two faces through which the flow enters the imaging volume. Moreover, the saturation region need not span an entire face of the imaging volume. Rather, if the entrance point of the two flows into the imaging volume is known from a priori information, the presaturation regions may be reduced in size and placed contiguous with the flow entrance points. Further, the imaging regions may be askew or canted relative to the face of the imaging volume in order to be disposed more clearly perpendicular to the flow to be saturated. Analogously, if one of the flows is entering the volume region at more than one point, presaturation regions may be defined across each entrance point. Any tagging technique may be utilized which identifies the flowing material. The image data in the first and second image memories 24 and 26 or image representations reconstructed from each of these data sets may be reviewed for the selected tagging. When the material is tagged by presaturation, the presaturation itself sets the tagged material to a near zero value.

Although the invention has been described with reference to the preferred embodiment, alterations and modifications will be apparent to those of ordinary skill in the art. It is intended that the invention be construed as including all such alterations and modifications insofar as they come within the scope of the appended claims or the equivalents thereof.

Having thus described the preferred embodiment, the invention is now claimed to be:

1. A method of magnetic resonance imaging of an image region which has flowing materials therein, the method comprising:

applying an RF saturation pulse concurrently with a gradient magnetic field pulse and a first frequency offset whose frequency and magnitudes are selected to define a first presaturation region at one side of the image region;

with a flow dependent imaging sequence, generating a first set of image data from material in the image region including first flowing material which flowed from the first presaturation region into the image region;

applying the RF saturation pulse concurrently with the gradient magnetic field pulse and a second frequency offset that is complementary to the first frequency offset to saturate second flowing material flowing into the image region from a second side;

with a flow dependent imaging sequence, generating a second set of image data from material in the image region including the second flowing material;

producing a difference image representation from the first and second image data sets in which static material cancels, one of the first and second flowing materials has positive image values, and the other of the first and second flowing materials has negative image values.

2. The method as set forth in claim 1 wherein the image data generating steps include manipulating magnetic field gradients to zero at least first order gradient moments in time such that flowing material in the image volume has a flow identifying phase modulated intensity in the generated magnetic resonance image data sets.

3. The method as set forth in claim 2 wherein the difference image producing step includes Fourier transforming the magnetic resonance data sets into image representations and subtracting the image representations.

4. The method as set forth in claim 2 further including displaying the difference image representation as a man readable image with the positive and negative image values differently represented visually in the same image.

5. The method as set forth in claim 5 wherein the first flowing material is displayed in one color and the second flowing material is displayed in another color.

6. The method as set forth in claim 1 wherein the frequency offsets are equal and opposite to define symmetric presaturation regions adjacent opposite faces of the imaging region.

7. A method of imaging first and second flowing materials, the method comprising:

presaturating the first flowing material before it flows into an imaging volume;

acquiring from the imaging volume a first set of imaging data in which the first flowing material in the imaging volume is saturated and other flowing material in the imaging volume is identified by a phase modulated intensity in the first image data set;

saturating the second flowing material before it flows into the imaging volume;

acquiring from the imaging volume a second set of imaging data in which the second flowing material in the imaging volume is saturated and other flowing material in the imaging volume is identified by a phase modulated intensity in the second image data set;

producing from the first and second image data sets a difference image representation in which static material is closely centered about a zero value, one of the flowing materials is centered about a large positive value and the other flowing material is centered around a large negative value.

8. A method of imaging flowing materials, the method comprising:

applying an RF saturation pulse concurrently with a gradient magnetic field pulse and a first frequency offset to presaturate first flowing material flowing into the image volume from one side;

acquiring from the imaging volume a first set of imaging data in which the first flowing material in the imaging volume is saturated and other flowing material in the imaging volume is identified by a phase modulated intensity in the first image data set;

applying the RF saturation pulse and the magnetic field gradient pulse concurrently with a complementary second frequency offset to saturate second flowing material flowing into the image volume from an other side;

acquiring from the imaging volume a second set of imaging data in which the second flowing material in the imaging volume is saturated and other flowing material in the imaging volume is identified by a phase modulated intensity in the second image data set;

producing from the first and second image data sets a difference image representation in which static material is closely centered about a first value, one of the flowing materials is centered about a second value and the other flowing material is centered around a third value.

9. The method as set forth in claim 8 wherein the difference image producing step includes transforming the first set of image data into a first image representation in which pixels containing the phase modulated intensity identified flowing material has large image values and pixels containing the presaturated flowing material have near zero image values, transforming the second set of image data into a second image representation in which pixels containing the phase modulated intensity identified flowing material has large image values and pixels containing the presaturated flowing material have near zero image values, and subtractively combining the first and second image representations to produce the difference image.

10. The method as set forth in claim 8 wherein the acquiring steps include nulling of at least first order gradient moments along at least one axis to induce the flow identifying phase modulated intensity.

11. The method as set forth in claim 8 further including during the acquiring of the first and second imaging data sets, applying magnetic field gradients that are configured to zero at least first order moments in time along three orthogonal axes of the imaging volume and to zero zeroth order moments along less than three orthogonal axes.

12. An apparatus for generating an image representation of first and second flowing materials, the apparatus comprising:

a means for presaturating the first flowing material before it flows into an imaging volume;

a means for acquiring from the imaging volume a first set of imaging data in which non-saturated flowing material and static material are identified by a first characteristic phase modulated intensity and in which the saturated first flowing material that flowed into the image region is identified by a second characteristic intensity;

a means for saturating the second flowing material before it flows into the imaging volume;

a means for acquiring from the imaging volume a second set of imaging data in which non-saturated flowing material and static material are identified by the first characteristic phase modulated intensity and in which the saturated second flowing material that flowed into the image region is identified by the second characteristic intensity;

a means for producing from the first and second image data sets a difference image representation in which static material is closely centered about a first characteristic value, one of the first and second flowing materials takes on second characteristic values and the other of the first and second flowing material takes on third characteristic values.

13. The apparatus as set forth in claim 12 wherein the producing means includes a Fourier transform means for transforming the first image data set into a first image representation and the second imaging data set into a second image representation, and a subtractive combining means for subtractively combining the first and second image representations into the difference image representation.

14. A method of magnetic resonance imaging two separately identifiable material flows in an image region within which flowing and static materials are disposed, the method comprising:

tagging material adjacent one side of the image region such that the tagged material has substantially zero brightness in a reconstructed first magnetic image representation;

with a magnetic resonance imaging sequence, generating a first set of image data from static and flowing materials in the image region;

reconstructing the first magnitude image representation from the first data set such that tagged flowing materials which entered the image region from the first side have substantially zero brightness and static materials and untagged flowing materials are represented by viewable gray scale values;

tagging material disposed adjacent a second side of the image region such that tagged material has substantially zero brightness in a reconstructed second magnitude image representation;

with the same magnetic resonance imaging sequence, generating a second set of image data from the static and flowing materials in the image region;

reconstructing the second set of image data into the second magnitude image representation in which tagged material flowing into the image region from the second side has substantially zero brightness and untagged flowing material and static material in the image region is represented by gray scale values;

combining the first and second magnitude image representations with a pixel by pixel magnitude subtraction to create a difference image representation in which the gray scale representations of the static material and any flowing material not entering the imaging region from the first and second sides substantially cancel, the flowing material which entered the image region from the first side and the flowing material which entered the image region from the second side are represented by complementary positive and negative viewable gray scale values.

15. A method of magnetic resonance imaging tagged materials in an image region, the method comprising:

tagging first material entering the image region such that the tagged first material that entered the image region has a characteristic intensity in a first reconstructed magnetic resonance image representation;

with a magnetic resonance imaging sequence, generating a first set of image data from static and flowing materials in the image region;

reconstructing the first image data set into the first image representation in which the tagged first material which entered the image region has the characteristic intensity and untagged flowing and static materials are represented by gray scale with a first intensity range;

tagging a second material entering the image region such that the tagged material that entered the image region has substantially the characteristic intensity in a second reconstructed image representation;

with the same imaging sequence, generating a second set of image data;

reconstructing the second set of image data into a second image representation in which the tagged first material which entered the image region has the characteristic intensity and untagged flowing and static materials are represented by gray scale with a second intensity range;

subtractively combining the first and second image representations to produce a difference image representation in which the static material and flowing material that is untagged in both the first and second image representations are represented by gray scale values with an intensity range that is a difference of the fist and second intensity ranges, the first tagged material is represented by gray scale values with an intensity range that is a difference of the characteristic intensity and the first intensity range, and the second tagged material is represented by gray scale values with an intensity range that is a difference of the characteristic intensity and the second intensity range.

16. The method as set forth in claim 15 wherein the characteristic intensity is substantially zero and the first and second intensity ranges are the same such that the difference between the first and second ranges is substantially zero.

* * * * *